US012690475B2

(12) United States Patent
McElhinny et al.

(10) Patent No.: US 12,690,475 B2
(45) Date of Patent: Jul. 21, 2026

(54) LITHOGRAPHY PILLAR PROCESS FOR EMBEDDED BRIDGE SCALING

(71) Applicant: Intel Corporation, Santa Clara, CA (US)

(72) Inventors: Kyle McElhinny, Tempe, AZ (US); Haobo Chen, Gilbert, AZ (US); Hongxia Feng, Chandler, AZ (US); Xiaoying Guo, Chandler, AZ (US); Leonel Arana, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 583 days.

(21) Appl. No.: 17/478,439

(22) Filed: Sep. 17, 2021

(65) Prior Publication Data

US 2023/0090350 A1     Mar. 23, 2023

(51) Int. Cl.
| | |
|---|---|
| *H10W 70/65* | (2026.01) |
| *H10W 70/05* | (2026.01) |
| *H10W 70/60* | (2026.01) |
| *H10W 70/63* | (2026.01) |
| *H10W 90/00* | (2026.01) |

(Continued)

(52) U.S. Cl.
CPC ......... *H10W 70/65* (2026.01); *H10W 70/093* (2026.01); *H10W 70/611* (2026.01); *H10W 70/635* (2026.01); *H10W 90/00* (2026.01); *H10W 90/701* (2026.01); *H10W 72/07252* (2026.01); *H10W 72/221* (2026.01)

(58) Field of Classification Search
CPC ............. H01L 23/5386; H01L 23/5385; H01L 23/5383; H01L 21/4853; H01L 21/4857; H01L 23/49811; H01L 23/5381; H01L 23/5384; H01L 24/16; H01L 24/17; H01L 24/19; H01L 24/04105; H01L 24/12105; H01L 24/214; H01L 24/73267; H01L 24/81192; H01L 24/92244; H01L 25/0655; H01L 25/0652; H01L 25/50; H01L 2224/16014; H01L 2224/16227; H01L 2224/1703; H01L 2924/15153; H01L 2924/15192; H01L 2924/15311
See application file for complete search history.

(56) References Cited

U.S. PATENT DOCUMENTS

| | | | |
|---|---|---|---|
| 2015/0235915 A1* | 8/2015 | Liang | H01L 25/0652 |
| | | | 361/764 |
| 2015/0279817 A1* | 10/2015 | Zhang | H01L 25/0657 |
| | | | 257/777 |
| 2019/0122974 A1* | 4/2019 | Goh | H01L 23/31 |

(Continued)

*Primary Examiner* — Marlon T Fletcher
*Assistant Examiner* — Christina A Sylvia
(74) *Attorney, Agent, or Firm* — Schwabe, Williamson & Wyatt, P.C.

(57) ABSTRACT

Embodiments disclosed herein include electronic packages. In an embodiment, the electronic package comprises a package substrate, and a first pad over the package substrate. In an embodiment, a layer is over the package substrate, where the layer is an insulating material. In an embodiment, the electronic package further comprises a via through the layer and in contact with the first pad. In an embodiment a first end of the via has a first width and a second end of the via that is in contact with the first pad has a second width that is larger than the first width. In an embodiment, the electronic package further comprises a second pad over the via.

14 Claims, 12 Drawing Sheets

(51) Int. Cl.
 *H10W 72/00* (2026.01)
 *H10W 72/20* (2026.01)

(56) References Cited

U.S. PATENT DOCUMENTS

2019/0304912 A1* 10/2019 Ecton .................. H01L 23/5386
2019/0341351 A1* 11/2019 May .................... H01L 23/5385
2019/0393145 A1* 12/2019 Pietambaram .......... H01L 24/80
2022/0310518 A1* 9/2022 Chen .................. H01L 21/4857

* cited by examiner

LITHOGRAPHY PILLAR PROCESS FOR EMBEDDED BRIDGE SCALING

TECHNICAL FIELD

Embodiments of the present disclosure relate to electronic packages, and more particularly to lithographically patterned pillars for embedded bridge scaling.

BACKGROUND

One architecture for electrically coupling together a pair of dies is to use a buried bridge die. The bridge die is buried in a package substrate. Pads and vias from the bridge die pass through the package substrate and through an overlying solder resist. Interconnects (e.g., solder or the like) are provided over the topmost pad, and the interconnects are directly connected to pads on the pair of dies. In this way, the first die can communicate with the second die.

Continued scaling in semiconductor packages has provided pressure to further reduce the sizes of the vias and pads for the bridge die. Currently, embedded bridge architectures cannot be extended to sub-45 μm pitch with cost efficient processes. It is challenging to create a material with the required via resolution, chemical, thermal, and mechanical reliability demanded of the solder resist layer.

One approach has been to form vias through the solder resist with a laser process. However, laser processes are slow and cost inefficient compared to optical lithography. The laser drilled vias also have a sidewall taper which results in a small via bottom. The smaller via bottom has a high reliability risk, especially for pitches below 45 μm.

Another approach that has been proposed is a lithographic via process. In the lithographic via process, a dry film resist (DFR) is used to define the vias, and copper pillars are plated in the openings of the DFR. The pillars are roughened and encapsulated with a buildup film. However, such processes are cost inefficient. The plating uniformity needed is also hard to achieve.

EMBODIMENTS OF THE PRESENT DISCLOSURE

Described herein are lithographically patterned pillars for embedded bridge scaling, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the continued scaling to smaller feature sizes in electronic packaging has resulted in the solder resist layer reaching practical limitations. That is, existing solder resist materials cannot support continued shrinking of the vias beyond the 45 μm pitch. Some approaches to improved scaling include laser drilled via approaches and lithographically defined via approaches.

Figure 1A:
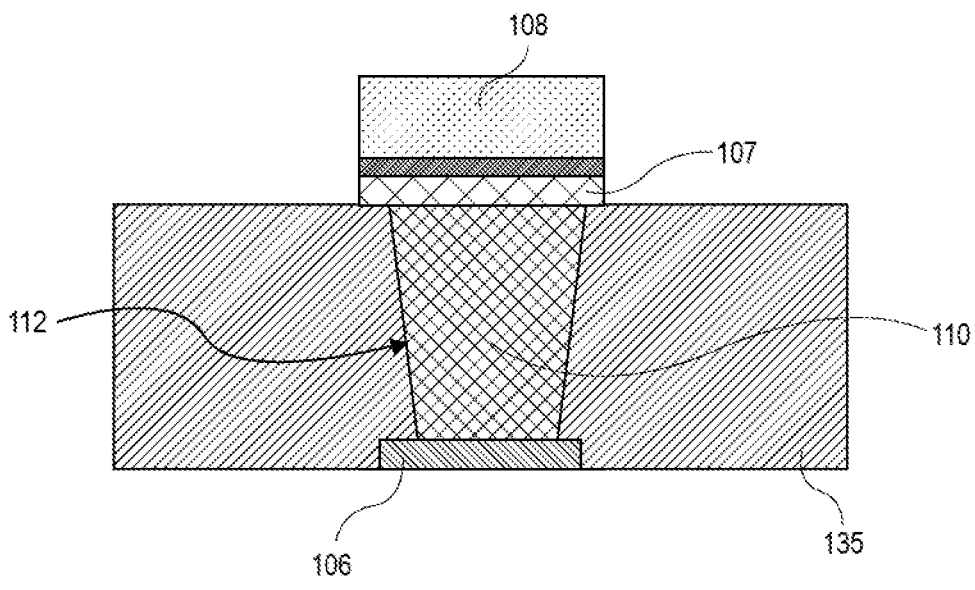
FIG. 1A is a cross-sectional illustration of a laser drilled via through a solder resist layer.

Referring now to FIG. 1A, a cross-sectional illustration of a laser drilled via is shown. The laser drilled via 110 may be provided through a solder resist layer 135. The laser drilled via 110 lands on a pad 106 and has an overlying pad 107. A solder 108 is provided over the pad 107. As shown, the via 110 has a tapered sidewall 112. The direction of the taper results in the bottom end of the via 110 being narrower than the top end of the via 110. The small interface between the via 110 and the pad 106 results in reliability issues. Additionally, it is to be appreciated that laser drilling processes are time consuming, and may not be suitable for high volume manufacturing (HVM) environments.

Figure 1B:
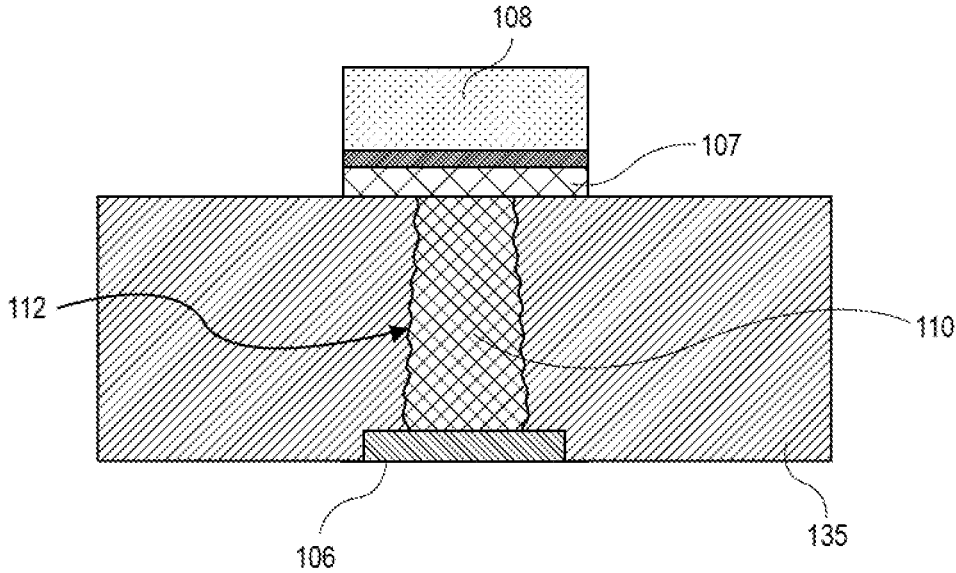
FIG. 1B is a cross-sectional illustration of a lithographically defined via that passes through a solder resist layer.

Referring now to FIG. 1B, a cross-sectional illustration of a lithographically defined via 110 is shown. As illustrated, the via 110 is a distinct metal pillar that is provided over an underlying pad 106. A second pad 107 is provided over the via 110. That is, there may be distinguishable interfaces (e.g., separate grain structures, etc.) at the interfaces between the via 110 and the pads 106 and 107. Additionally, the lithographically defined via 110 requires an etching process to roughen the via 110. As such, the sidewalls 112 of the via 110 may have a characteristically rough texture, compared to the smooth sidewalls described in greater detail below.

Accordingly, embodiments disclosed herein include methods to fabricate vias through the solder resist material that allow for smaller pitch devices, while remaining cost efficient. Particularly, embodiments disclosed herein allow for the decoupling of the resolution burden of the solder resist from other properties (e.g., coefficient of thermal expansion (CTE), mechanical properties, chemical resistance, and the like). This allows for scaling of a widest diameter of the vias down to approximately 10 μm or below. In some embodiments, the scaling allows for a widest diameter of the vias to be approximately 5 μm or below. As used herein, "approximately" refers to a value within 10% of the stated value. For example, approximately 10 μm refers to a range between 9 μm and 11 μm. The improved scaling is particularly beneficial for embedded bridge architectures. The small scale of the interconnects allows for more connections between dies than is currently possible.

In an embodiment, the reduction in pitch of the vias is enabled by a lithographic patterning process. In an embodiment, a dry film resist (DFR) is disposed over the top metal pads. The DFR is patterned to form pillars. The pillars are then encapsulated in the solder resist layer. The solder resist layer is recessed to expose the pillars. The pillars are then stripped out, leaving behind solder resist vias with their critical dimensions (CDs) defined by the DFR. Standard first level interconnect (FLI) processes can then be built directly on top of the solder resist layer.

As such, embodiments disclosed herein bypass the expensive and time-consuming laser or pillar plating operations and enables the necessary scaling using existing tool sets. Another advantage is the via profile. The vias may have larger bottom diameters, which can significantly improve the via reliability.

Figure 2A:
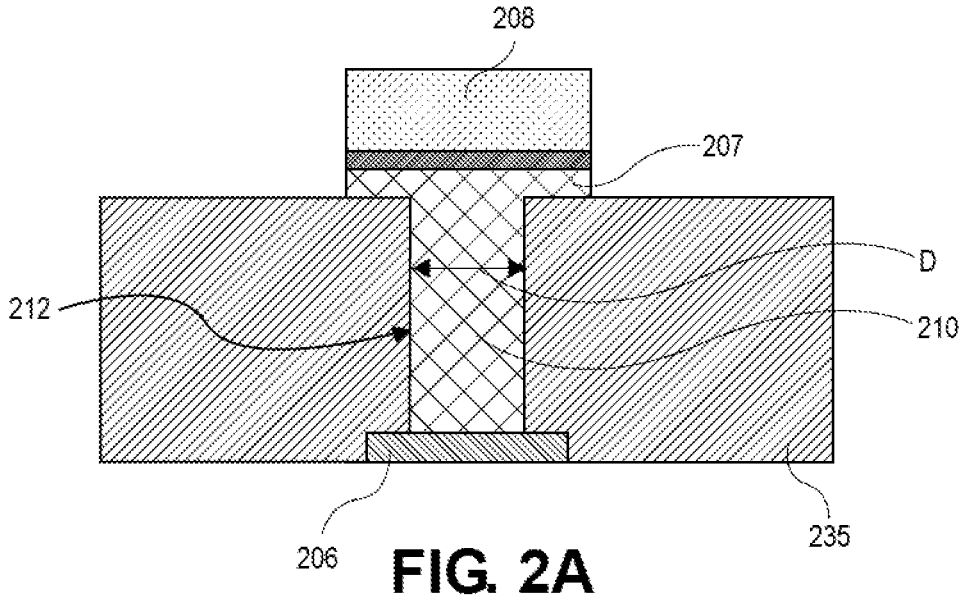
FIG. 2A is a cross-sectional illustration of a lithographically defined pillar via, in accordance with an embodiment.

Referring now to FIG. 2A, a cross-sectional illustration of a solder resist layer 235 with a via 210 is shown, in accordance with an embodiment. In an embodiment, the solder resist layer 235 may cover a first pad 206. The bottom of the via 210 may land on the first pad 206. As indicated by the different shading, there may be a visible seam between the via 210 and the first pad 206 since the two features are plated with different processes. As such, the grain structure between the via 210 and the first pad 206 may be discontinuous. In an embodiment, a second pad 207 is provided over the via 210 and the solder resist layer 235. The second pad 207 is shown as the same shading as the via 210. This indicates that the second pad 207 and the via 210 may be formed with a single process and may have a continuous grain structure between the two features. In an embodiment, the second pad 207 may be a first level interconnect (FLI) pad 207. A solder 208 may be plated over the top surface of the second pad 207.

In an embodiment, the via 210 has a substantially vertical sidewall 212. That is, the width of the via 210 at the interface with the first pad 206 may be substantially similar to the width of the via 210 at the interface with the second pad 207. Additionally, it is to be appreciated that sidewall 212 may have a relatively smooth surface. As used herein, a smooth surface may refer to a smoothness that is typical of a conductor plating process (e.g., electroless plating, electroplating, or the like). That is, a smooth surface is a surface that has not been intentionally roughed (e.g., with an etching process) similar to the via 110 described with respect to FIG. 1B.

As will be described in greater detail below, the processing used to form a via 210 similar to the one shown in FIG. 2A allows for reduced feature sizes. In a particular embodiment, a width D of the via 210 may be approximately 10 μm or smaller, or approximately 5 μm or smaller. As such, fine pitch interconnects can be made using the processes described herein. This is particularly beneficial when used in conjunction with embedded bridge architectures, which require reduced pitches and feature sizes in order to accommodate a large number of interconnects between dies.

Figure 2B:
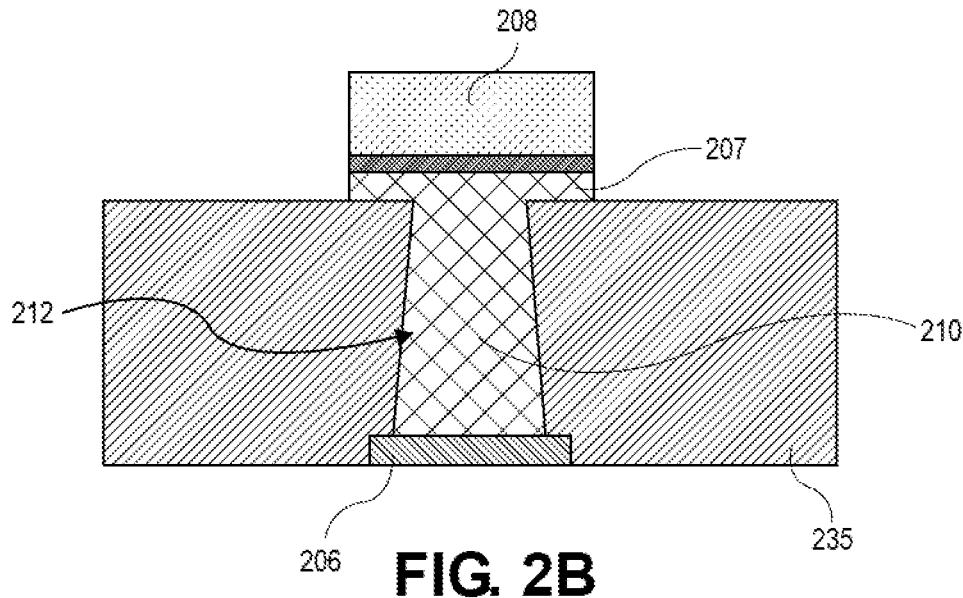
FIG. 2B is a cross-sectional illustration of a lithographically defined pillar via with tapered sidewalls, in accordance with an embodiment.

Referring now to FIG. 2B, a cross-sectional illustration of a via 212 is shown, in accordance with an additional embodiment. The via 212 in FIG. 2B may be substantially similar to the via 212 in FIG. 2A, with the exception of the profile of the sidewalls 212. Instead of being substantially vertical, the sidewalls 212 may have a taper. The taper of the sidewalls 212 may be opposite from the taper of the sidewalls 112 in FIG. 1A. That is, a width of the via 212 at the first pad 206 may be greater than a width of the via 212 at the second pad 207. As such, reliability issues due to small interfaces at the first pad 206 (i.e., similar to the case shown in FIG. 1A) are avoided.

Figure 3A:
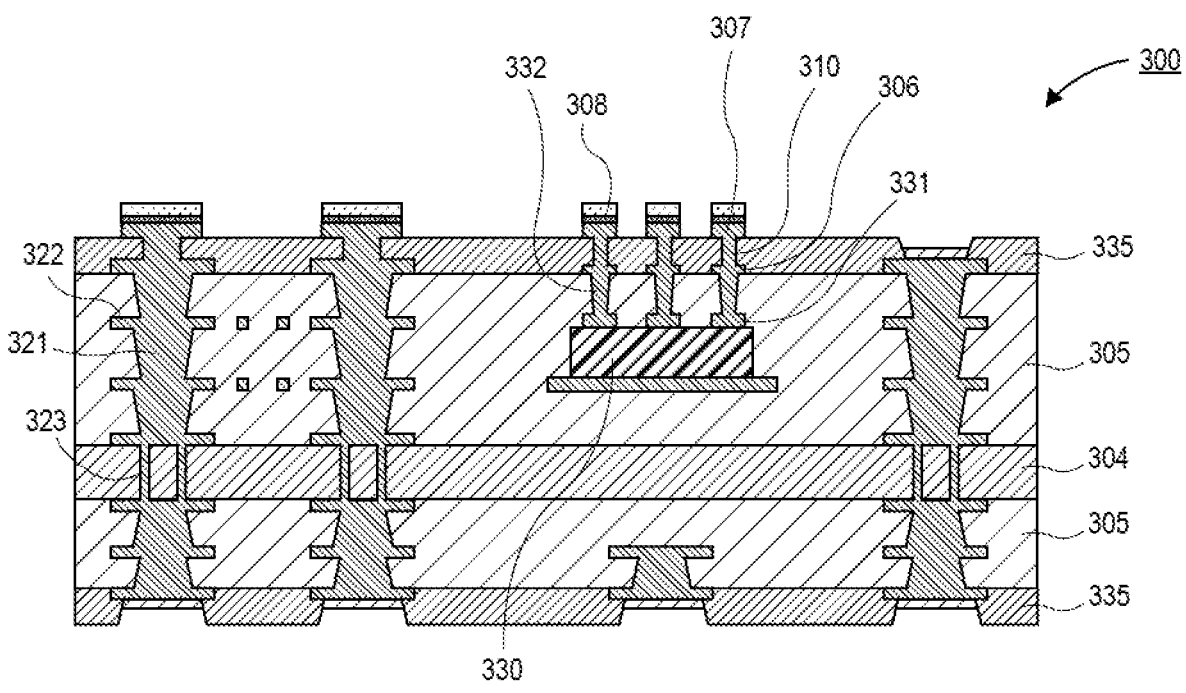
FIG. 3A is a cross-sectional illustration of an electronic package with lithographically defined pillar vias over an embedded bridge, in accordance with an embodiment.

Referring now to FIG. 3A, a cross-sectional illustration of an electronic package 300 is shown, in accordance with an embodiment. In an embodiment, the electronic package 300 may comprise a core 304 with buildup layers 305 above and below the core 304. While a core 304 is shown, it is to be appreciated that in some embodiments, the electronic package 300 may be coreless. In an embodiment, conductive features (e.g., pads 322, vias 321, traces, etc.) may be provided in the buildup layers 305. In an embodiment, through core vias 323 may be provided through the core 304 in order to electrically couple the front side of the electronic package 300 to the backside of the electronic package 300.

In an embodiment, an embedded bridge 330 may be provided in the buildup layers 305. A bridge pad 331 may be coupled to a first pad 306 by a via 332. In an embodiment, a solder resist layer 335 may be provided over the buildup layers 305 and over the first pad 306. In an embodiment, a via 310 passes through the solder resist layer 335 to connect the first pad 306 to a second pad 307. The second pad 307 may be an FLI pad 307 with a solder 308 plated over the second pad 307.

In an embodiment, the via 310 may be substantially similar to either of the vias 210 in FIGS. 2A and 2B. That is, the sidewalls of the via 310 may be substantially vertical or have a negative taper (so that the via 310 is wider at the bottom). In an embodiment, the vias 310 may have a width that is approximately 10 μm or smaller, or approximately 5 μm or smaller. In an embodiment, the pitch between the second pads 307 may be approximately 20 μm or smaller, or approximately 10 μm or smaller.

Figure 3B:
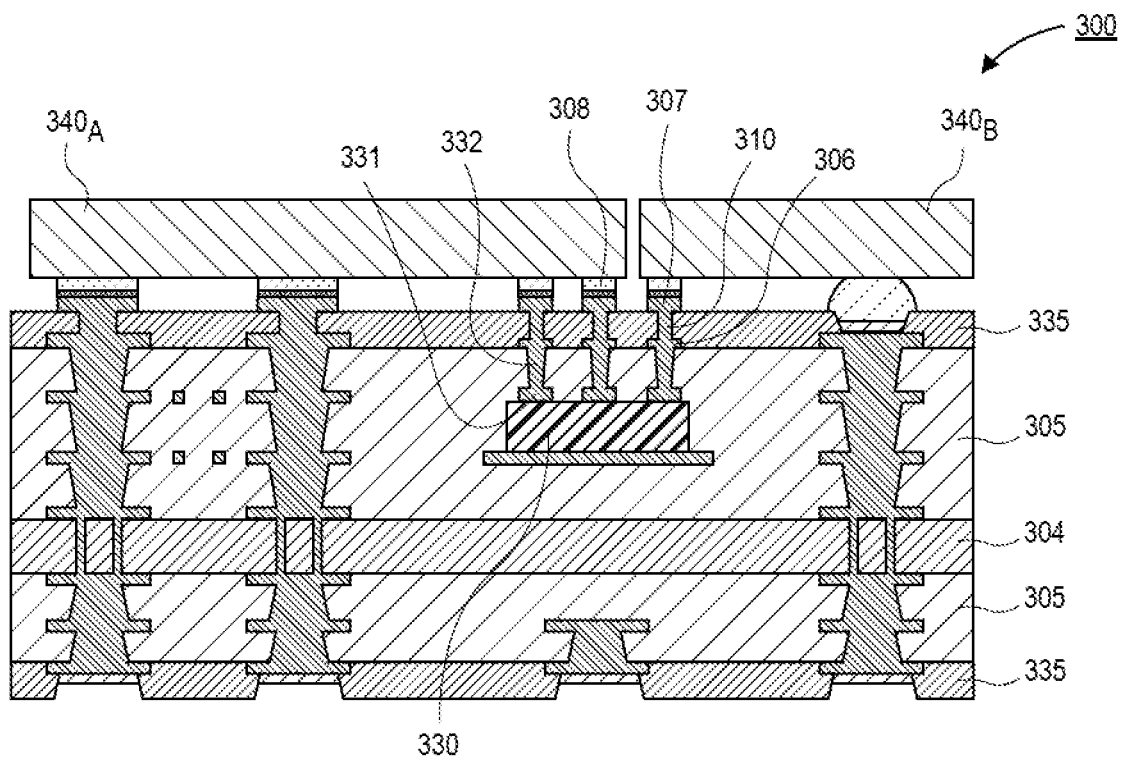
FIG. 3B is a cross-sectional illustration of an electronic package with dies coupled to an embedded bridge by lithographically defined pillar vias, in accordance with an embodiment.

Referring now to FIG. 3B, a cross-sectional illustration of an electronic package 300 is shown, in accordance with an additional embodiment. The electronic package 300 in FIG. 3B may be substantially similar to the electronic package 300 in FIG. 3A, with the addition of dies 340 attached to the second pads 307. In an embodiment, a first die 340A may be coupled to a second die 340B by the embedded bridge 330. The dies 340A and 340B may be coupled to the embedded bridge 330 by the solders 308, the second pads 307, the vias 310, and the first pads 306. The first pads 306 are coupled to the embedded bridge 330 by the vias 332 and the bridge pads 331.

Figure 4A:
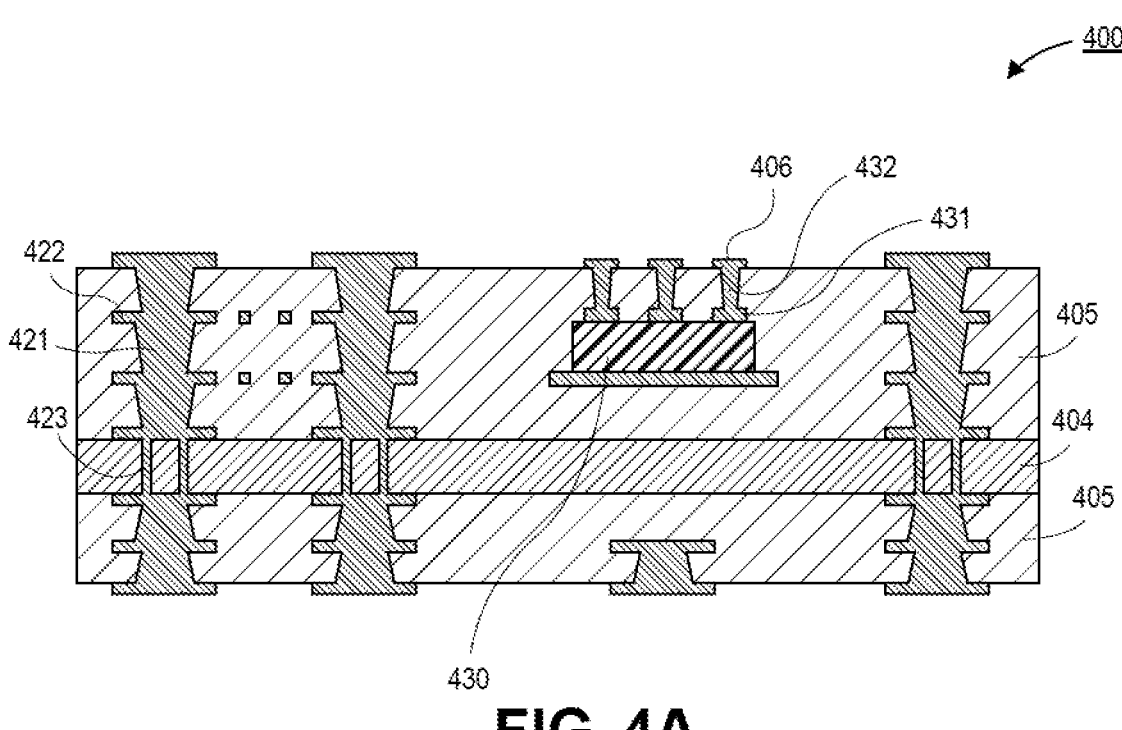
FIGS. 4A-4N are cross-sectional illustration depicting a process for forming an electronic package with lithographically defined pillar vias, in accordance with an embodiment.
Figure 4B:
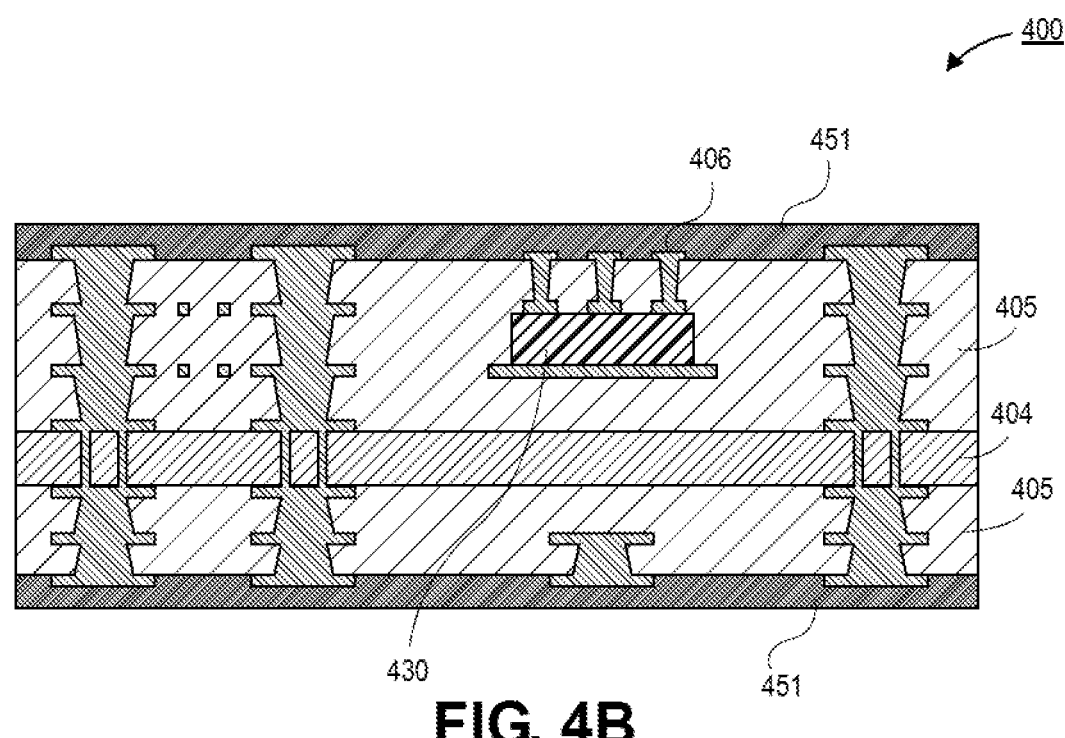
Figure 4C:
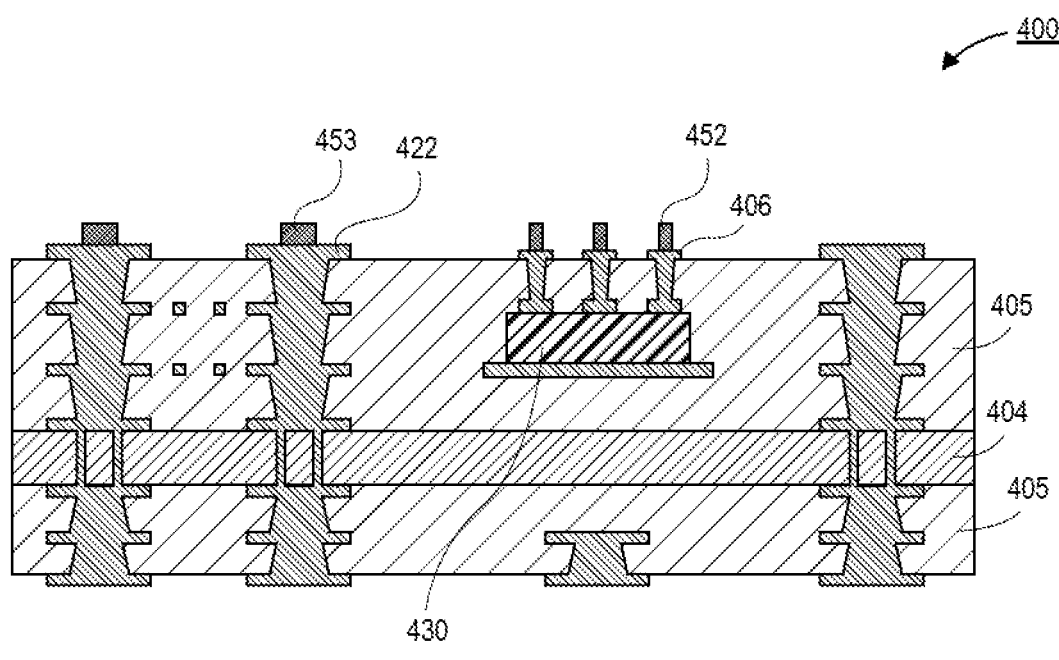
Figure 4D:
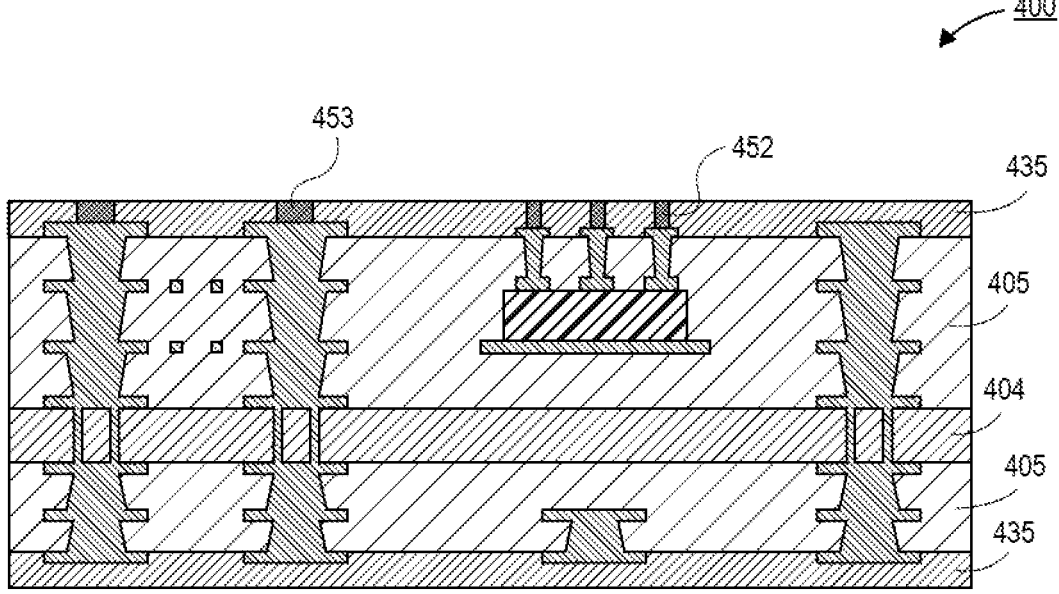
Figures 4E, 4F:
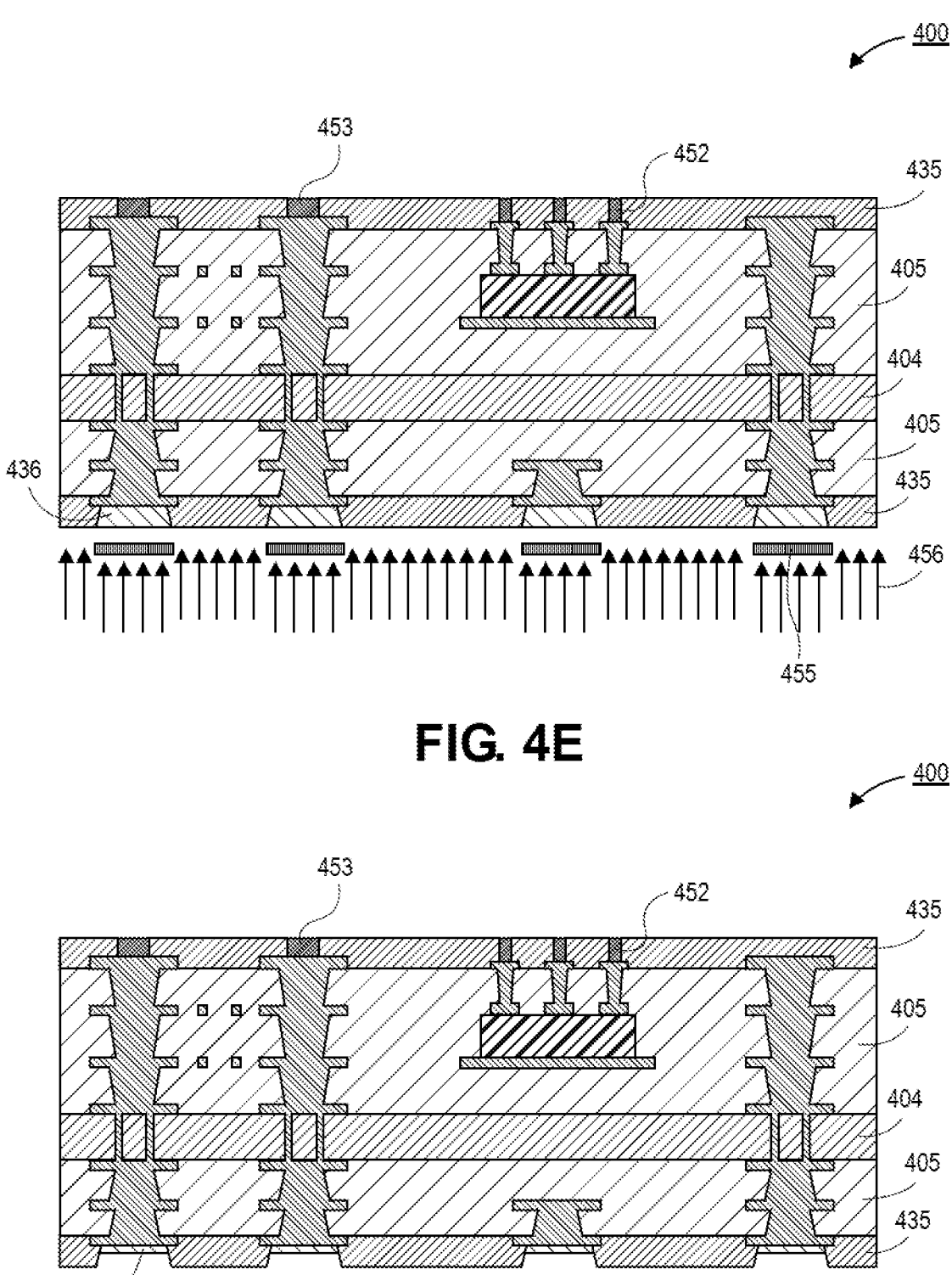
Figure 4G:
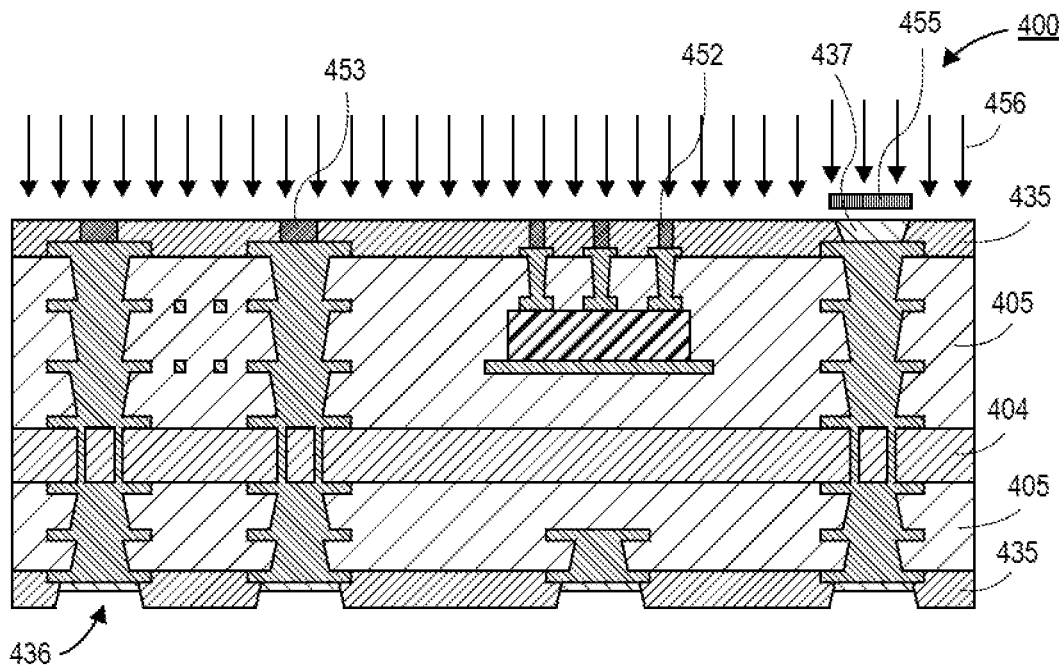
Figure 4H:
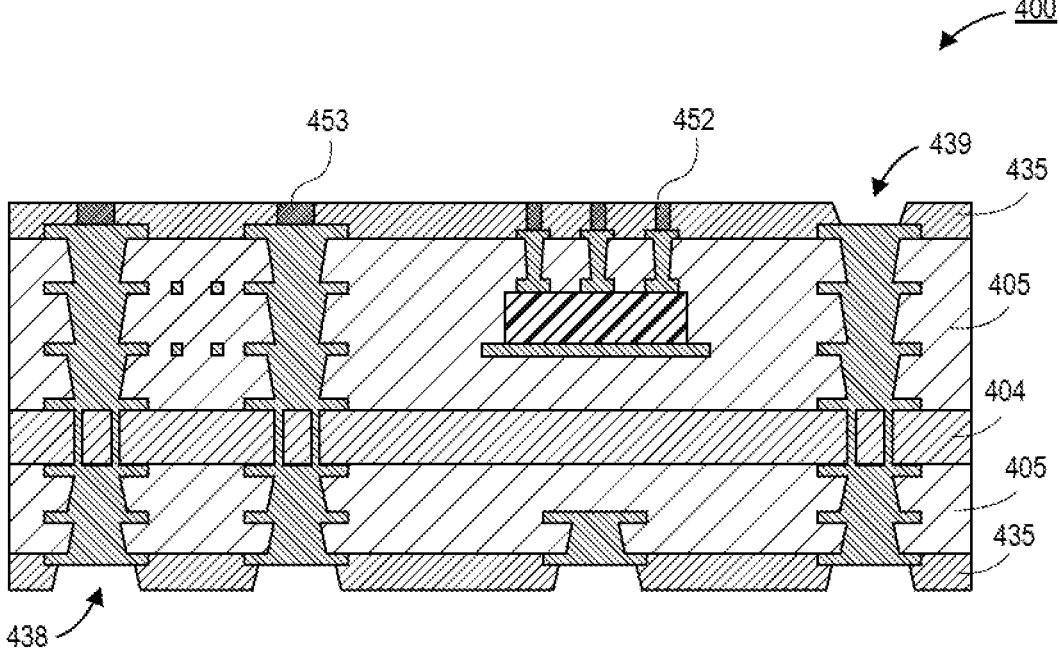
Figures 4I, 4J:
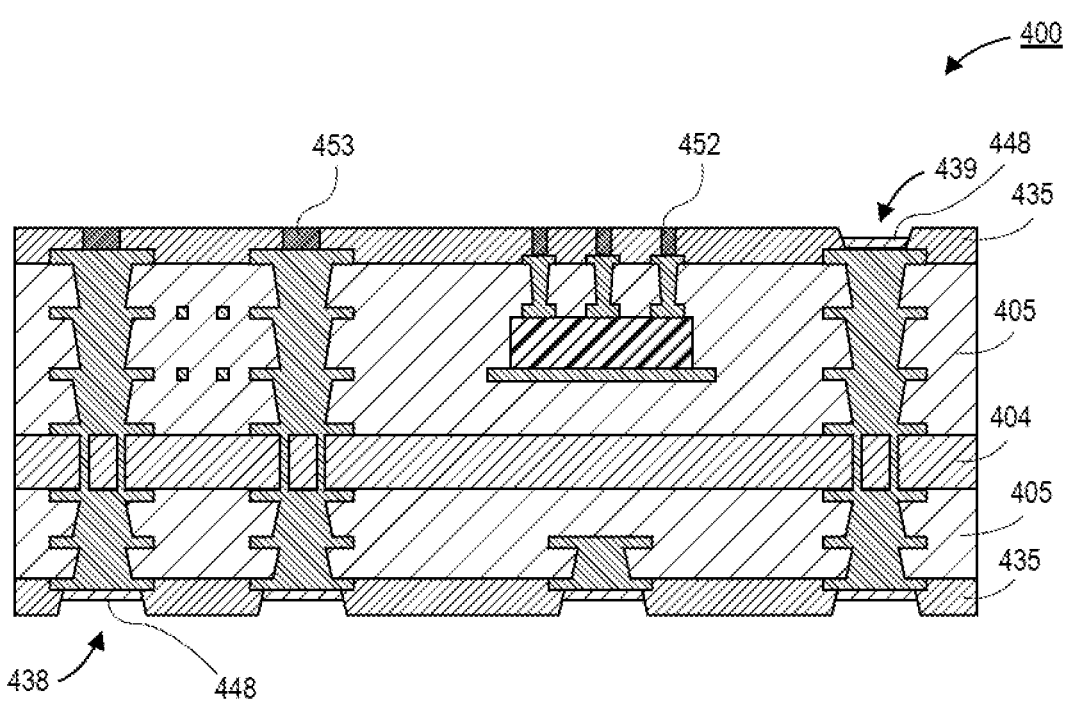
Figure 4K:
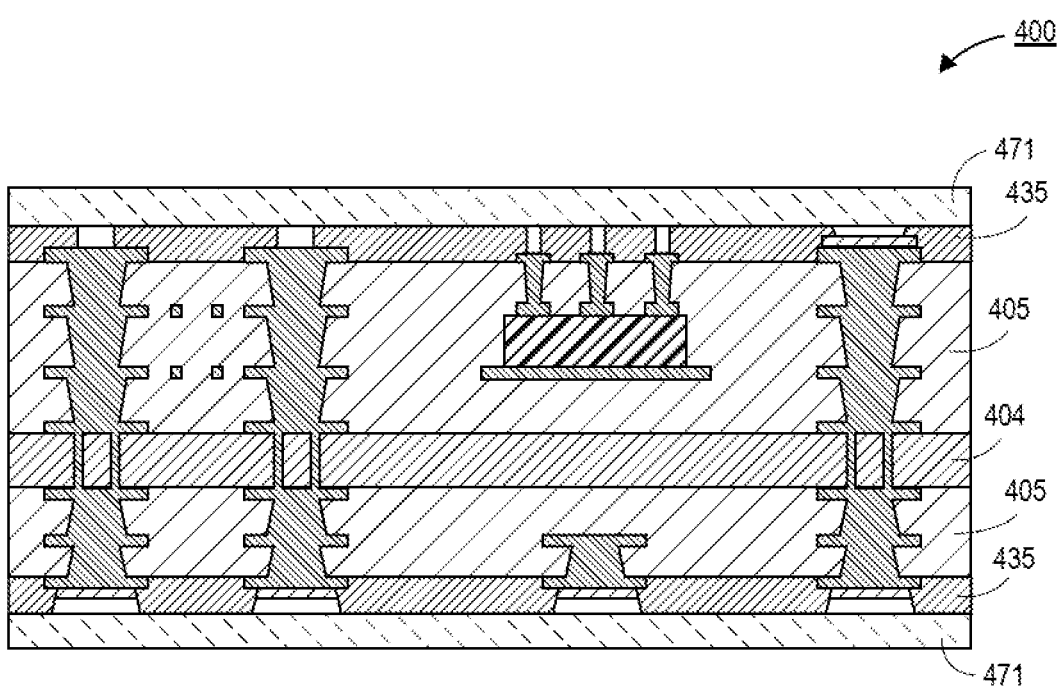
Figure 4L:
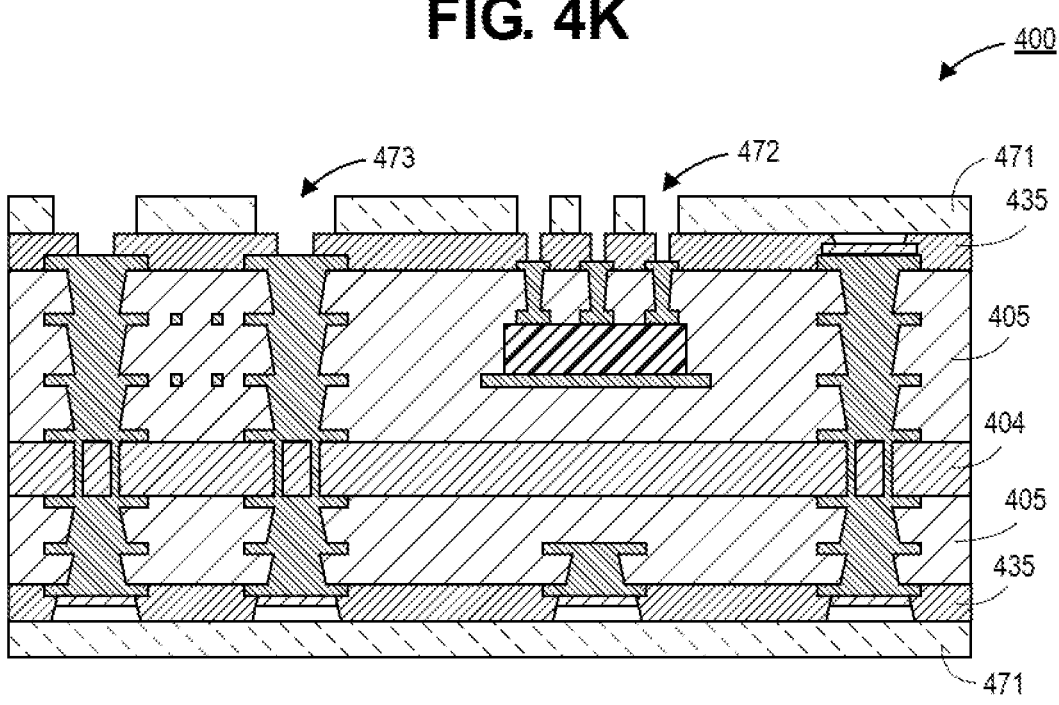
Figure 4M:
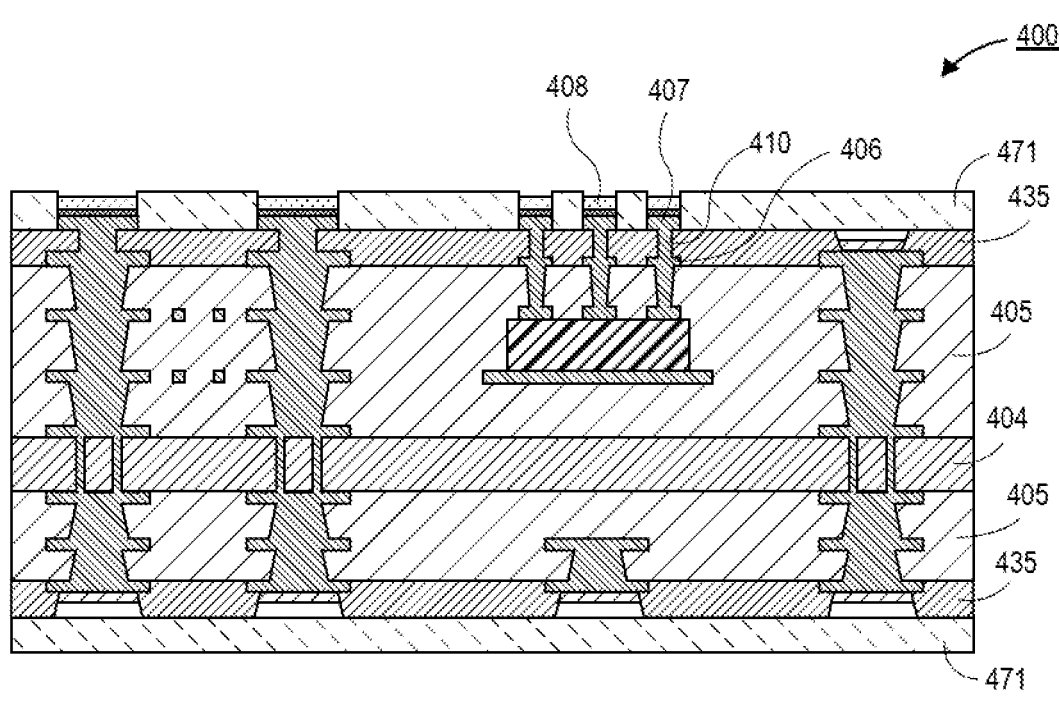
Figure 4N:
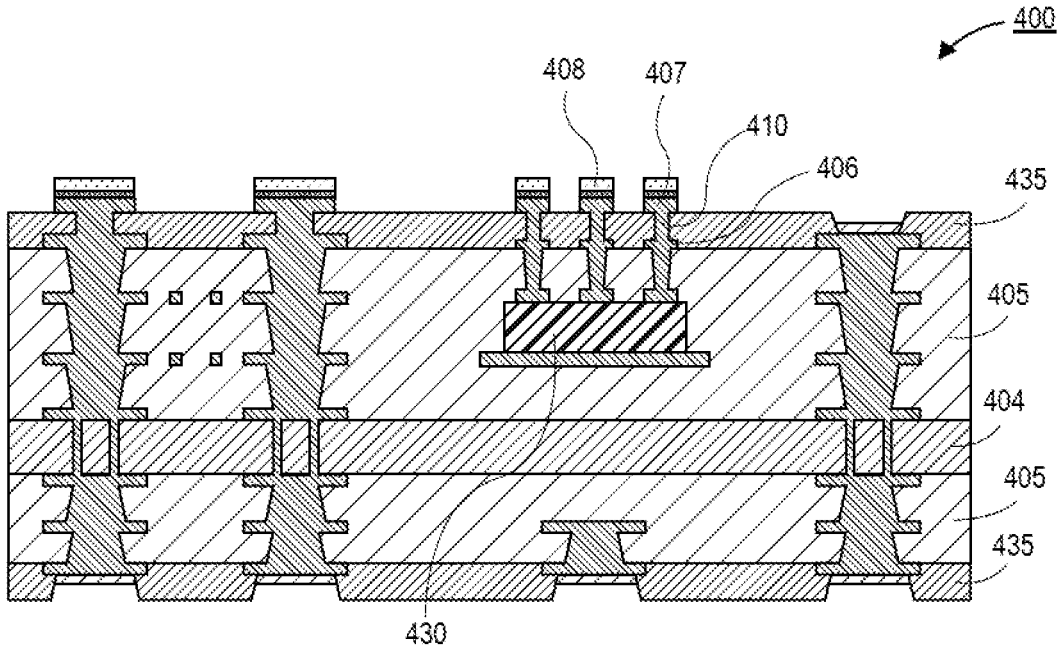

Referring now to FIGS. 4A-4N, a series of cross-sectional illustrations depicting a process for forming an electronic package 400 is shown, in accordance with an embodiment. In the embodiments illustrated, the vias through the solder resist are formed with a DFR scaffolding. That is, a DFR layer is patterned to form the shape of the vias. A solder resist is then disposed around the patterned DFR layer. Stripping the DFR layer leaves behind a via opening that is the desired size and pitch. In this way, a fine pitch and small critical dimensions of the vias can be obtained without needing to pattern the solder resist, which has sub-optimal limits on minimum pitch and critical dimension.

Referring now to FIG. 4A, a cross-sectional illustration of an electronic package 400 is shown, in accordance with an embodiment. In an embodiment, the electronic package 400 comprises a core 404 and buildup layers 405 above and below the core 404. However, in some embodiments, the electronic package 400 may be coreless, and only the buildup layers 405 may be present. In an embodiment, conductive routing (e.g., pads 422, vias 421, and traces) may be embedded within the buildup layers 405. Through core vias 423 may provide electrical coupling through the core 404.

In an embodiment, a bridge die 430 is embedded in the buildup layers 405. The bridge die 430 may be a semiconductor substrate, such as a silicon substrate. The bridge die 430 may be a die that includes conductive traces (not shown) in order to provide high density interconnections between overlying dies (attached in a subsequent processing operation). In some embodiments, the bridge die 430 is passive. In other embodiments, the bridge die 430 may have active circuitry (e.g., transistors and the like).

In an embodiment, bridge pads 431 may be provided over a top surface of the bridge die 430. The bridge pads 431 may be coupled to first pads 406 by vias 432. The vias 432 may be laser drilled vias in the buildup layer 405. As such, the vias 432 may have a tapered profile with a bottom width that is smaller than a top width. In an embodiment, the first pads 406 may be provided over a top surface of the topmost buildup layer 405.

Referring now to FIG. 4B, a cross-sectional illustration of the electronic package 400 after a DFR 451 is applied over the buildup layers 405 is shown, in accordance with an embodiment. In an embodiment, the DFR 451 may be applied with a lamination process, such as a vacuum lamination process. The DFR 451 may have a thickness that is substantially similar to a thickness of a subsequently formed solder resist layer. As such, features patterned into the DFR 451 are able to pass entirely through the solder resist layer.

Referring now to FIG. 4C, a cross-sectional illustration of the electronic package 400 after the DFR 451 is patterned is shown, in accordance with an embodiment. In an embodiment, the DFR 451 may be patterned with a lithographic process. The DFR 451 may be optimized to form fine features with fine critical dimensions and small pitches. In an embodiment, the DFR 451 may be patterned to form via placeholders 452 over the first pads 406. In an embodiment, a width of the via placeholders 452 may be approximately 10 μm or less, or approximately 5 μm or less. A pitch between the placeholders 452 may be approximately 20 μm or less, or approximately 10 μm. In an embodiment, sidewalls of the via placeholders 452 may be substantially vertical. In other embodiments, the sidewalls of the via placeholders 452 may be negatively tapered so that a bottom of the via placeholders 452 is wider than a top of the via placeholders 452. Additional via placeholders 453 may be provided over pads 422 that are not over the bridge die 430. The via placeholders 453 may be wider than the via placeholders 452.

Referring now to FIG. 4D, a cross-sectional illustration of the electronic package 400 after a solder resist layer 435 is disposed over the buildup layers 405 is shown, in accordance with an embodiment. In an embodiment, the solder resist layers 435 may have a thickness that is greater than the height of the via placeholders 452 and 453. The solder resist layers 435 may be deposited with a lamination process, or the like. Since the via placeholders 452 define the shape of the subsequently formed vias, existing solder resist materials may be used for the solder resist layers 435. That is, fine pitch and small critical dimension features may be manufactured without the need to redesign the composition of the solder resist material.

Referring now to FIG. 4E, a cross-sectional illustration of the electronic package 400 after backside solder resist openings are patterned is shown, in accordance with an embodiment. The backside solder resist layer 435 may be exposed with radiation 456 that cures the solder resist layer 435. Masks 455 may be provided across the backside of the electronic package 400 to block the radiation 456 from regions where the solder resist openings are desired. As such, unexposed regions 436 are provided in the backside solder resist layer 435.

Referring now to FIG. 4F, a cross-sectional illustration of the electronic package 400 after a solder resist 435 thinning process is implemented is shown, in accordance with an embodiment. In an embodiment, the thinning process may recess the thickness of the top solder resist 435 so that the via placeholders 452 and 453 are exposed. Additionally, the thinning process may result in the unexposed region 436 on the backside solder resist 435 being removed faster than the exposed regions of the solder resist 435. In an embodiment, the solder resist 435 thinning process can remove a specific amount of solder resist from the surface without planarization. This can be used to remove the small amount of solder resist 435 above the via placeholders 452 and 453.

Referring now to FIG. 4G, a cross-sectional illustration of the electronic package 400 after a front side cure is implemented is shown, in accordance with an embodiment. In an embodiment, the front side solder resist layer 435 may be exposed with radiation 456 to cure the solder resist layer 435. In an embodiment, a mask 455 may be used to block regions of the solder resist 435. For example, unexposed regions 437 may be locations where DSCs or FIDs are to be populated.

Referring now to FIG. 4H, a cross-sectional illustration of the electronic package 400 after full developing of the solder resist layers 435 is shown, in accordance with an embodiment. As shown, the developing process results in the backside solder resist openings 438 being formed. The backside openings 438 expose the underlying pads on the surface of the bottom buildup layers 405. Additionally, the patterning may include the removal of the unexposed region 437 in the top solder resist 435 to form an opening 439 on the front side of the electronic package 400. At this point in the processing flow, the via placeholders 452 and 453 may still be present within the top solder resist layer 435.

Referring now to FIG. 4I, a cross-sectional illustration of the electronic package 400 after a surface finish plating process is shown, in accordance with an embodiment. In an embodiment, surface finishes 448 may be provided over each of the exposed copper pads. For example, a surface finish 448 may be provided on the exposed copper in the opening 439, and a surface finish 448 may be provided on the exposed copper in the backside solder resist openings 438 on the backside of the electronic package 400. In an embodiment, the surface finish 448 may be any suitable surface finish. For example, the surface finish 448 may comprise nickel. In an embodiment, the surface finish 448 may include multiple layers or alloys of various materials.

Referring now to FIG. 4J, a cross-sectional illustration of the electronic package after the via placeholders 452 and 453 are removed is shown, in accordance with an embodiment. The via placeholders 452 and 453 may be removed with a stripping process that selectively removes the DFR material and leaves the solder resist layers 435 substantially unaltered. The removal of the via placeholders 452 and 453 results in the formation of via openings 462 and 463. The via openings 462 and 463 match the shape of the via placeholders 452 and 453. That is, the via openings 462 may have substantially vertical sidewalls, or sidewalls with a negative taper (e.g., narrower at the top and wider at the bottom). Additionally, the via openings 462 may have the minimal critical dimensions and/or tight pitch of the via placeholders 452. For example, the via openings 462 may have a width of 10 μm or smaller, or 5 μm or smaller, and the pitch may be 20 μm or smaller, or 10 μm or smaller.

Referring now to FIG. 4K, a cross-sectional illustration of the electronic package 400 after a DFR 471 is applied over the surfaces is shown, in accordance with an embodiment. In an embodiment, the DFR 471 is applied with a lamination process over the front side surface and the backside surface of the electronic package 400. In an embodiment, the DFR 471 may have a thickness that is greater than the desired thickness of the FLI pads. As such, during a plating process, the FLI pads can be deposited and there will still be additional room to plate a surface finish and solder over the FLI pads.

Referring now to FIG. 4L, a cross-sectional illustration of the electronic package 400 after FLI openings 472 and 473 are formed is shown, in accordance with an embodiment. In an embodiment, the FLI openings 472 and 473 may be formed with any suitable process. For example, a lithographic patterning and develop process may be used to form the FLI openings 472 and 473. The FLI openings 472 may be aligned over the via openings 462, and the FLI openings 473 may be aligned over the via openings 463. In an embodiment, the FLI openings 472 are wider than the underlying via openings 462. Similarly, the FLI openings 473 are wider than the underlying via openings 463. In an embodiment, a pitch between the FLI openings 472 may be approximately 45 μm or smaller, or approximately 20 μm or smaller.

Referring now to FIG. 4M, a cross-sectional illustration of the electronic package 400 after the vias 410 and the FLI pads 407 are plated is shown, in accordance with an embodiment. In an embodiment, the FLI pads 407 and the vias 410 are plated with a single continuous process. As such, there may not be a seam between the top of the via 410 and the bottom of the FLI pad 407. That is, the grain structure from the via 410 to the FLI pad 407 may be continuous. In an embodiment, a surface finish may be applied over the FLI pads 407. The surface finish may comprise nickel or any other suitable surface finish material or materials. In an embodiment, a solder 408 may be plated over the surface finishes.

Referring now to FIG. 4N, a cross-sectional illustration of the electronic package 400 after the DFR 471 is stripped is shown, in accordance with an embodiment. In an embodiment, the DFR 471 may be stripped with any suitable process. The remaining structure includes the bridge die 430 being coupled to the solder 408 by the first pads 406, the vias 410, and the FLI pads 407. After the DFR 471 is stripped, the electronic package 400 is ready for the dies to be attached and the backside to be coupled to a board or the like.

Figure 5:
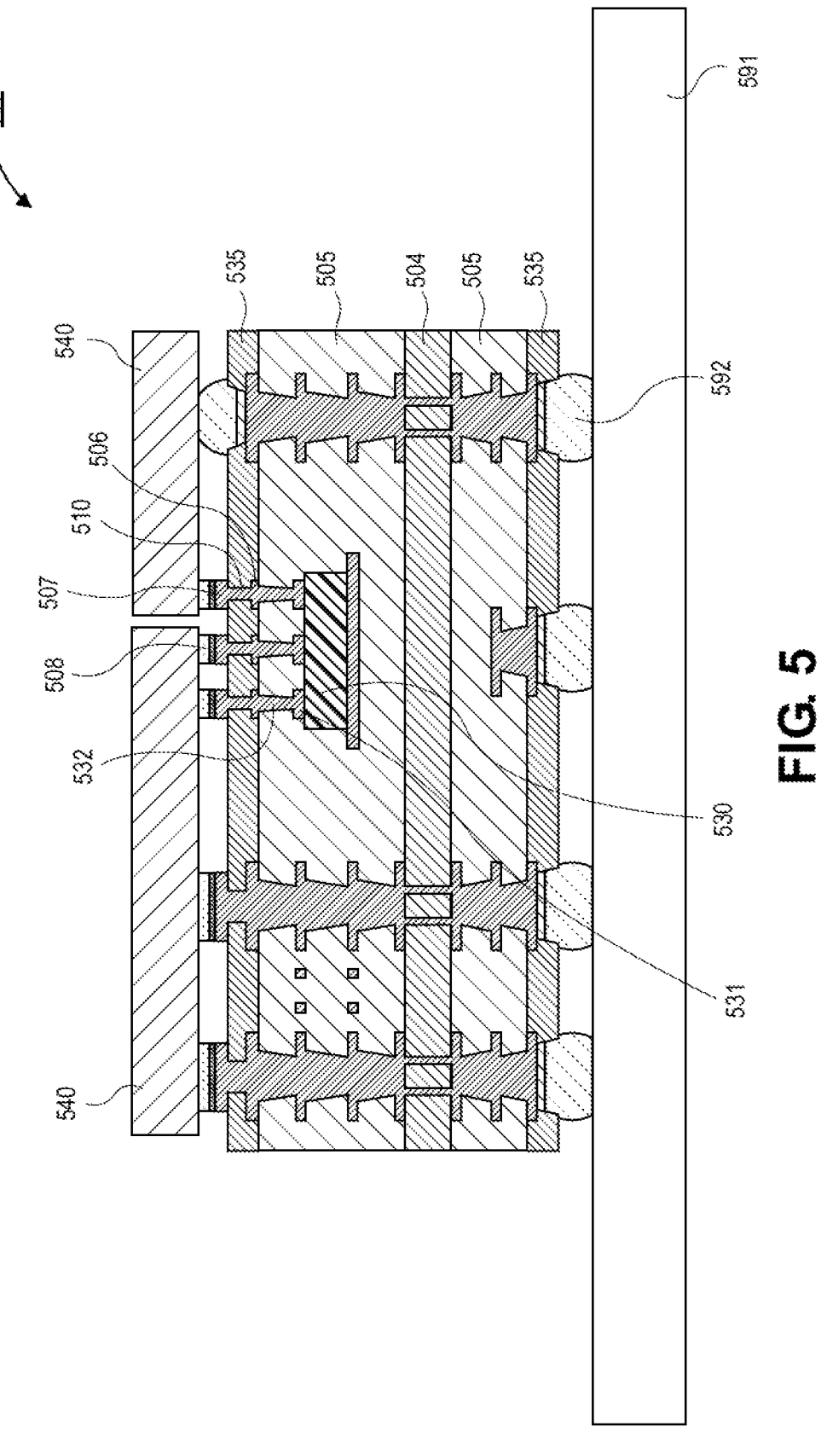
FIG. 5 is a cross-sectional illustration of an electronic system with lithographically defined pillar vias to couple together a pair of dies, in accordance with an embodiment.

Referring now to FIG. 5, a cross-sectional illustration of an electronic system 590 is shown, in accordance with an embodiment. In an embodiment, the electronic system 590 may comprise a board 591, such as a printed circuit board (PCB). In an embodiment, the board 591 may be coupled to a package substrate. For example, interconnects 592 may couple the board 591 to the bottom buildup layers 505 of the package substrate. The interconnects 592 are shown as solder bumps, but it is to be appreciated that the interconnects 592 may be any suitable second level interconnect (SLI) architecture.

In an embodiment, the package substrate may comprise a core 504 with buildup layers 505 over and under the core 504. However, in some embodiments, the package substrate may be coreless. In an embodiment, solder resist layers 535 are over the buildup layers 505. In an embodiment, an embedded bridge 530 is provided in the top buildup layers 505. The embedded bridge 530 may be coupled to the solder 508 through FLI pads 507, vias 510, first pads 506, vias 532, and bridge pads 531. The embedded bridge 530 may communicatively couple the dies 540 together.

Figure 6:
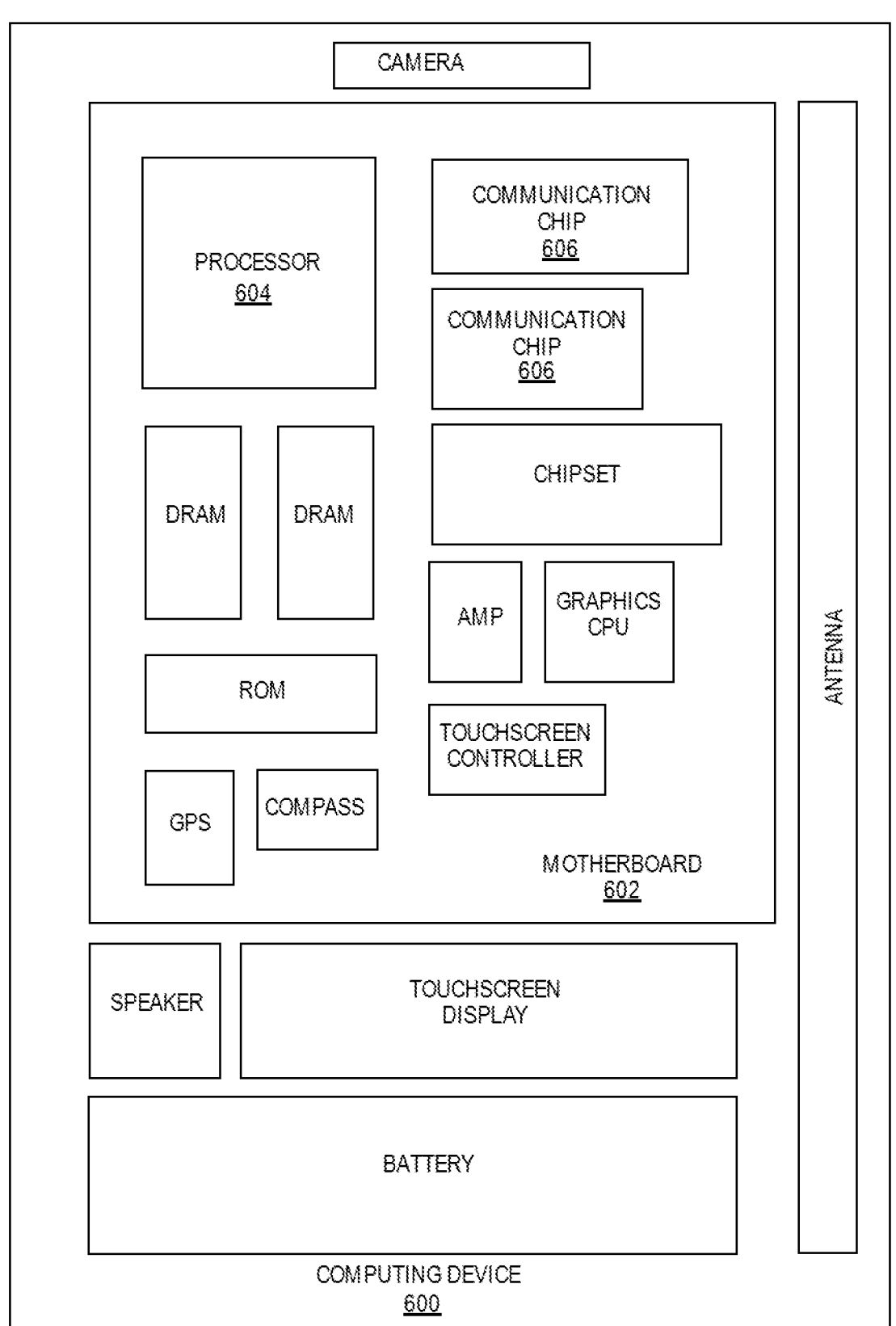
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be part of an electronic package that comprises an embedded bridge that is coupled to the solder by a via through the solder resist that comprises vertical or negatively tapered sidewalls, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be part of an electronic package that comprises an embedded bridge that is coupled to the solder by a via through the solder resist that comprises vertical or negatively tapered sidewalls, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a first pad over the package substrate; a layer over the package substrate, wherein the layer is an insulating material; a via through the layer and in contact with the first pad, wherein a first end of the via has a first width and a second end of the via that is in contact with the first pad has a second width that is larger than the first width; and a second pad over the via.

Example 2: the electronic package of Example 1, wherein there is no seam at the interface between the via and the second pad.

Example 3: the electronic package of Example 1 or Example 2, wherein a sidewall of the via is tapered.

Example 4: the electronic package of Examples 1-3, wherein a width of the second pad is approximately 10 μm or smaller.

Example 5: the electronic package of Examples 1-4, wherein the first pad is electrically coupled to a bridge embedded in the package substrate.

Example 6: the electronic package of Examples 1-5, wherein a sidewall of the via is smooth.

Example 7: the electronic package of Examples 1-6, further comprising: a solder over the second pad.

Example 8: The electronic package of Examples 1-7, further comprising: a third pad over the package substrate; a second via through the layer and contacting the third pad; and a fourth pad over and second via.

Example 9: the electronic package of Example 8, wherein the second via has a width that is greater than a width of the via.

Example 10: the electronic package of Example 8, wherein the fourth pad is substantially similar to the second pad, and wherein a distance between the fourth pad and the second pad is approximately 10 μm or smaller.

Example 11: an electronic package, comprising: a package substrate; a bridge die embedded in the package substrate; a plurality of pads over the package substrate and electrically coupled to the bridge die; a layer over the plurality of pads and the package substrate; and a plurality of vias through the layer, wherein the vias have sloped sidewalls that result in top ends of the vias being narrower than bottom ends of the vias.

Example 12: the electronic package of Example 11, wherein a pitch between the plurality of vias is approximately 10 μm or smaller.

Example 13: the electronic package of Example 11 or Example 12, further comprising a plurality of second pads, wherein individual ones of the plurality of second pads are over a respective one of the plurality of vias.

Example 14: the electronic package of Example 13, wherein there is no seam between individual ones of the plurality vias and the corresponding ones of the plurality of second pads.

Example 15: the electronic package of Examples 11-14, wherein sidewalls of the plurality of vias are smooth.

Example 16: the electronic package of Examples 11-15, further comprising: a first die coupled to first ones of the plurality of vias; and a second die coupled to second ones of the plurality of vias.

Example 17: the electronic package of Example 16, wherein traces on the bridge die electrically couple the first die to the second die.

Example 18: a method of forming an electronic package, comprising: providing a first pad over a package substrate; disposing a first dry film resist over the first pad and the package substrate; patterning a pillar from the first dry film resist, wherein the pillar is over the first pad; disposing a layer over the package substrate and the pillar: stripping the pillar from the layer to form a via opening through the layer; disposing a second dry film resist over the layer; patterning an opening through the second dry film resist, wherein the opening is over the via opening; and disposing a metal in the via opening and the opening to form a via and a second pad.

Example 19: the method of Example 18, wherein there is no seam between the via and the second pad.

Example 20: the method of Examples 18 or Example 19, wherein sidewalls of the via are tapered.

Example 21: the method of Example 20, wherein a top end of the via is narrower than a bottom end of the via.

Example 22: the method of Examples 18-21, wherein a width of the via is approximately 10 μm or smaller.

Example 23: the electronic system, comprising: a board; a package substrate coupled to the board, wherein the package substrate comprises: a bridge die embedded in the package substrate; a plurality of first pads over the package substrate and electrically coupled to the bridge die; a layer over the plurality of pads and the package substrate; a plurality of vias through the layer, wherein the vias have sloped sidewalls that result in top ends of the vias being narrower than bottom ends of the vias; and a plurality of second pads, wherein individual ones of the second pads are over corresponding ones of the plurality of vias; and a first die and a second die coupled to the package substrate by interconnects that are coupled to the plurality of second pads.

Example 24: the electronic system of Example 23, wherein a pitch between the plurality of second pads is approximately 10 μm or smaller.

Example 25: the electronic system of Example 23 or Example 24, wherein there is no seam between vias and the second pads.

What is claimed is:

1. An electronic package, comprising:
a package substrate;
a first pad over the package substrate;
a layer over the package substrate, wherein the layer is an insulating material;
a via through the layer and in contact with the first pad, wherein a first end of the via has a first width and a second end of the via that is in contact with the first pad has a second width that is larger than the first width;
a second pad over the via, wherein there is no seam at the interface between the via and the second pad;
a third pad over the package substrate;

a second via through the layer and contacting the third pad; and a fourth pad over the second via, wherein the fourth pad is substantially similar to the second pad, and wherein a distance between the fourth pad and the second pad is approximately 10 μm or smaller.

2. The electronic package of claim 1, wherein a sidewall of the via is tapered.

3. The electronic package of claim 1, wherein a width of the second pad is approximately 10 μm or smaller.

4. The electronic package of claim 1, wherein the first pad is electrically coupled to a bridge embedded in the package substrate.

5. The electronic package of claim 1, wherein a sidewall of the via is smooth.

6. The electronic package of claim 1, further comprising: a solder over the second pad.

7. The electronic package of claim 1, wherein the second via has a width that is greater than a width of the via.

8. An electronic package, comprising:

a package substrate;

a first pad over the package substrate;

a layer over the package substrate, wherein the layer is an insulating material;

a via through the layer and in contact with the first pad, wherein a first end of the via has a first width and a second end of the via that is in contact with the first pad has a second width that is larger than the first width;

a second pad over the via;

a third pad over the package substrate;

a second via through the layer and contacting the third pad; and a fourth pad over the second via, wherein the fourth pad is substantially similar to the second pad, and wherein a distance between the fourth pad and the second pad is approximately 10 μm or smaller.

9. The electronic package of claim 8, wherein a sidewall of the via is tapered.

10. The electronic package of claim 8, wherein a width of the second pad is approximately 10 μm or smaller.

11. The electronic package of claim 8, wherein the first pad is electrically coupled to a bridge embedded in the package substrate.

12. The electronic package of claim 8, wherein a sidewall of the via is smooth.

13. The electronic package of claim 8, further comprising: a solder over the second pad.

14. The electronic package of claim 8, wherein the second via has a width that is greater than a width of the via.

* * * * *